(12) United States Patent
Bergmann

(10) Patent No.: US 10,547,284 B2
(45) Date of Patent: Jan. 28, 2020

(54) CASCADED RESONATOR

(71) Applicant: SNAPTRACK, INC., San Diego, CA (US)

(72) Inventor: Andreas Bergmann, Haiming (DE)

(73) Assignee: QUALCOMM Incorporated, San Diego, CA (US)

( * ) Notice: Subject to any disclaimer, the term of this patent is extended or adjusted under 35 U.S.C. 154(b) by 81 days.

(21) Appl. No.: 15/572,130

(22) PCT Filed: Apr. 13, 2016

(86) PCT No.: PCT/EP2016/058127
§ 371 (c)(1),
(2) Date: Nov. 6, 2017

(87) PCT Pub. No.: WO2016/180593
PCT Pub. Date: Nov. 17, 2016

(65) Prior Publication Data
US 2018/0123564 A1 May 3, 2018

(30) Foreign Application Priority Data
May 8, 2015 (DE) .................... 10 2015 107 231

(51) Int. Cl.
H03H 9/145 (2006.01)
H03H 9/64 (2006.01)
(Continued)

(52) U.S. Cl.
CPC .... *H03H 9/14582* (2013.01); *H03H 9/02724* (2013.01); *H03H 9/145* (2013.01);
(Continued)

(58) Field of Classification Search
CPC ............ H03H 9/02724; H03H 9/0274; H03H 9/02755; H03H 9/02992; H03H 9/145; H03H 9/1455; H03H 9/14523; H03H 9/14532; H03H 9/14576; H03H 9/14582; H03H 9/14588; H03H 9/25; H03H 9/64;
(Continued)

(56) References Cited

U.S. PATENT DOCUMENTS 3,600,710 A    8/1971  Adler et al.
4,223,284 A    9/1980  Inoue et al.
(Continued)

FOREIGN PATENT DOCUMENTS

EP     1394940 A1      3/2004
JP     09-008598 A  *  1/1997

OTHER PUBLICATIONS

International Search Report and Written Opinion—PCT/EP2016/058127—ISA/EPO—dated Jul. 22, 2016.

*Primary Examiner* — Barbara Summons
(74) *Attorney, Agent, or Firm* — Patterson & Sheridan, LLP

(57) ABSTRACT

In a resonator, two interdigital transducers (W1,W2) are electrically series-connected and arranged next to each other in the longitudinal direction within an acoustic track delimited by reflectors. Between the two interdigital transducers, a transition area (UEB) is formed in that the finger period p, which is defined as the distance between the finger centers of adjacent transducer fingers, is higher in comparison to the remaining interdigital transducer.

11 Claims, 6 Drawing Sheets

Figure 3:
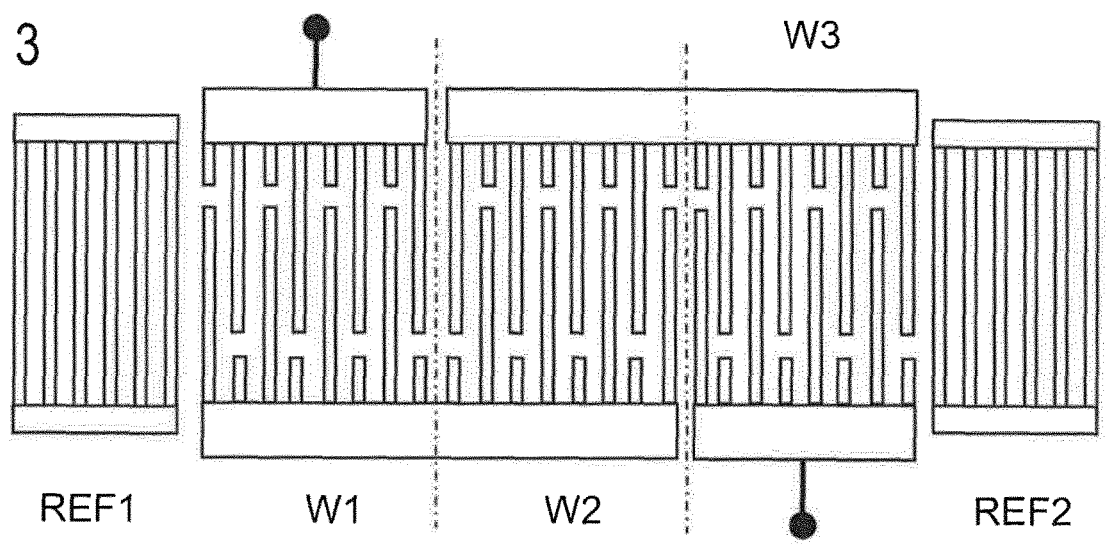

(51) Int. Cl.
*H03H 9/02* (2006.01)
*H03H 9/25* (2006.01)

(52) U.S. Cl.
CPC ...... *H03H 9/1455* (2013.01); *H03H 9/14588* (2013.01); *H03H 9/25* (2013.01); *H03H 9/6436* (2013.01); *H03H 9/6483* (2013.01); *H03H 9/6489* (2013.01)

(58) Field of Classification Search
CPC .. H03H 9/6436; H03H 9/6483; H03H 9/6489; H03H 9/6496
USPC .................. 333/193, 195; 310/313 B, 313 D
See application file for complete search history.

(56) References Cited

U.S. PATENT DOCUMENTS

| | | | |
|---|---|---|---|
| 5,363,074 A * | 11/1994 | Higgins, Jr. ....... | H03H 9/14514 310/313 B |
| 6,801,100 B2 * | 10/2004 | Nakamura ........... | H03H 9/0038 310/313 B |
| 7,528,684 B1 | 5/2009 | Rao et al. | |
| 2004/0251989 A1 | 12/2004 | Takagi et al. | |
| 2005/0206272 A1 * | 9/2005 | Inoue ................ | H03H 9/14588 310/313 B |
| 2005/0212620 A1 * | 9/2005 | Bauer ................. | H03H 9/0042 333/193 |
| 2006/0091976 A1 * | 5/2006 | Nakazawa ......... | H03H 9/14588 333/133 |
| 2007/0109075 A1 * | 5/2007 | Igaki ................... | H03H 9/0274 333/195 |

* cited by examiner

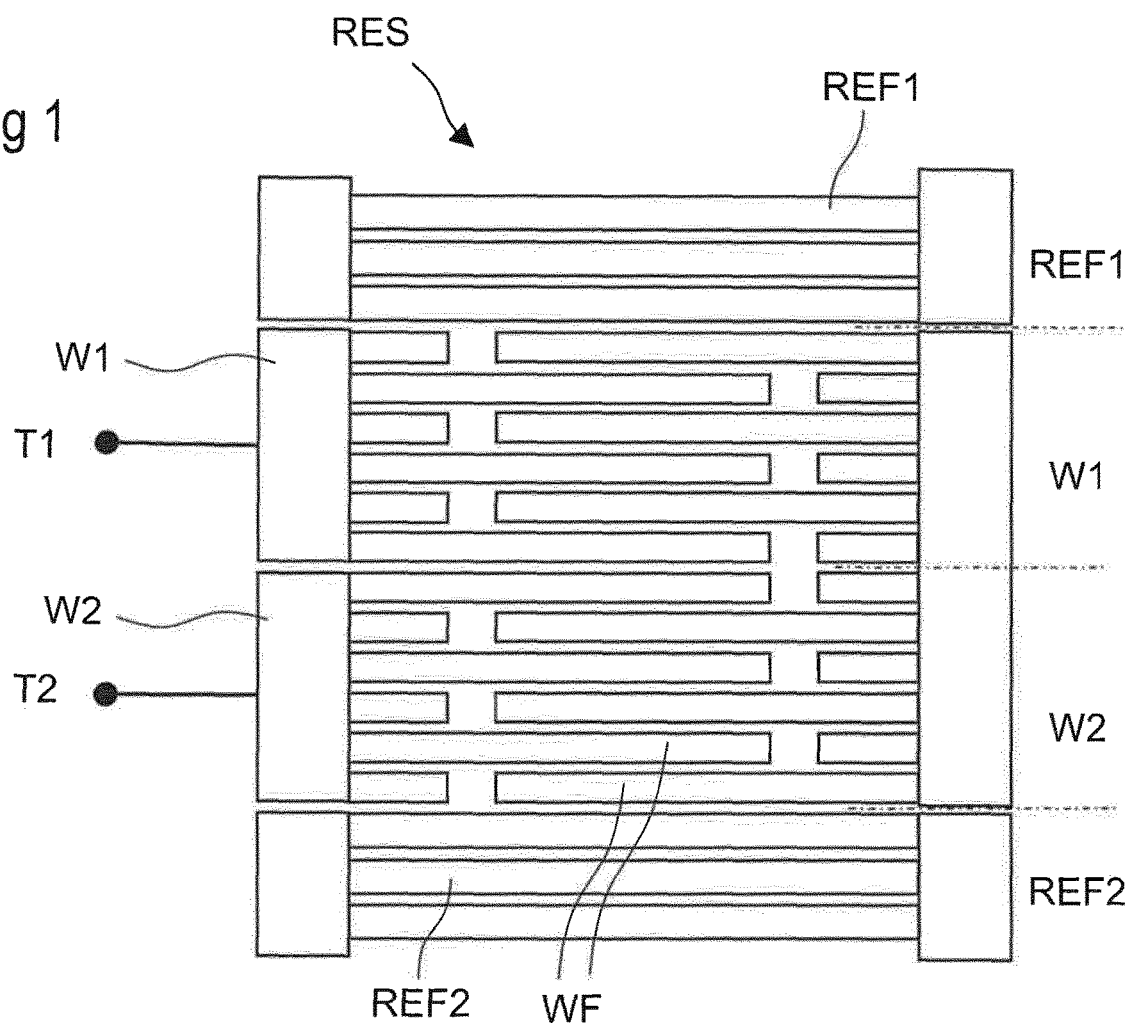
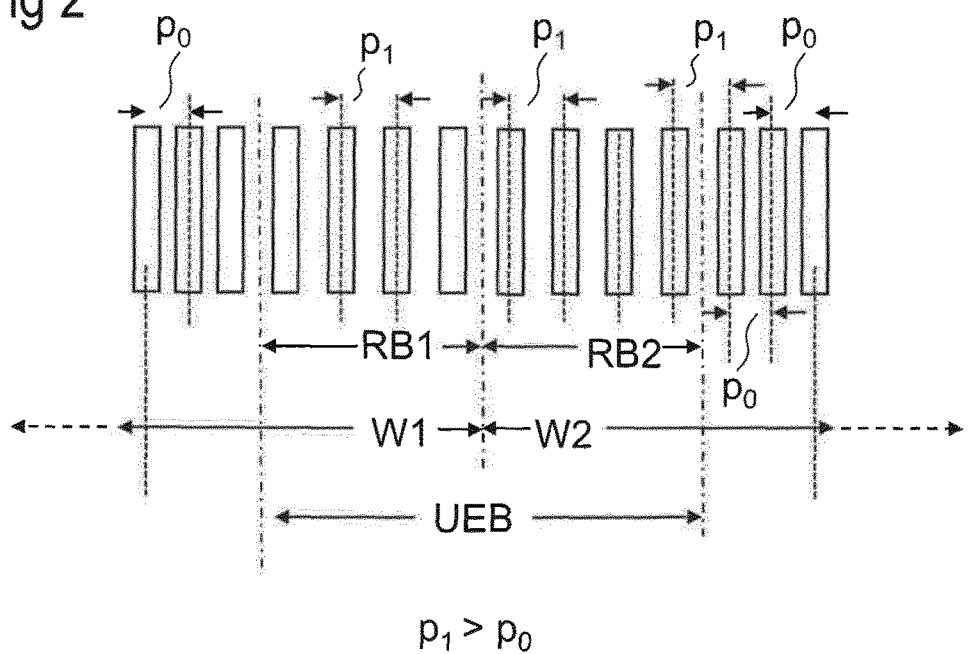

CASCADED RESONATOR

CROSS-REFERENCE TO RELATED APPLICATIONS

This application is a national stage application under 35 U.S.C. 371 of PCT/EP2016/058127, filed Apr. 13, 2016, which claims the benefit of German Patent Application Serial No. 102015107231.9, filed on May 8, 2015, both of which are incorporated herein by reference in their entirety.

The invention relates to a cascaded resonator as can be used in particular for reactance filters, as well as reactance filters produced therefrom.

Filters with high power compatibility and extreme edge steepness are increasingly demanded for modern mobile radio units. A high edge steepness is important since the individual frequency bands must be cleanly separated from each other by the corresponding filters, and frequently there is only a small transition area between two frequency bands to be separated. When filters are used as TX filters, a low insertion loss is important in addition to the edge steepness and power compatibility in order to minimize electrical and acoustic losses in the filter. An additional filter requirement is high close range selection.

For achieving high edge steepness, DMS filters are preferred to reactance filters. However, they are unsuitable as transmission filters (TX filters) due to their low power compatibility.

Reactance filters that are constructed from conventional single-gate resonators have better power compatibility. Reactance filters can be realized using SAW as well as BAW resonators, wherein the latter are particularly power compatible. These reactants filters result in insufficient rolloff, however.

In a special application for a selected mobile radio band (such as band 13), a TX filter with a passband is required that has a very steep left edge in order to distinguish the filter from band NS07. The parallel resonators with the highest resonance frequency are responsible for the left edge in a reactance filter. In order to make this edge steep, the static capacity of the parallel resonator with the highest resonance frequency must be smaller than the static capacity of the other parallel resonators.

In order to reduce the static capacity of a SAW single-gate resonator while simultaneously taking into account the minimum number of electrode fingers in the resonator, two or more single-gate resonators can be cascaded. This however results in a significant requirement for area on the surface of the filter chip and makes miniaturizing the filter more difficult. Alternatively to cascading in the transverse direction, an electric series interconnection of resonators or interdigital transducers that are arranged in the same acoustic track is possible. In this case, the additional area requirement for the serial in-line interconnection only increases by the factor n when n interdigital transducers with the same number of output fingers are interconnected to each other. With transverse cascading, the necessary area increases by the factor $n^3$.

The object of the present invention is to present an SAW resonator suitable for use in a reactance filter by means of which a steep edge passband filter with low insertion loss can be realized.

This object is achieved according to the invention by a resonator as further described herein, for example, with respect to FIGS. 1-5. Advantageous embodiments of the invention are provided in additional claims.

The resonator according to the invention has an acoustic track that is delimited on both sides by reflectors. Two interdigital transducers are arranged next to each other in the acoustic track in the longitudinal direction. The two interdigital transducers are electrically series-connected between two connections. A number n of terminal transducer fingers of one of the interdigital transducer and/or of a reflector form a transition area, or are assigned to a transition area. Within the transition area, the finger period, which is defined as the distance between the finger centers of adjacent transducers or between the finger centers of adjacent reflector strips in the reflector, is greater than the finger period in the remaining transducer or reflector. The number n is small in comparison to the overall number of transducer fingers of the interdigital transducers or reflector strips of the reflectors, wherein however the following preferably applies: 1<n<10.

The transition area can be disposed between two interdigital transducers or between an interdigital transducer and a reflector. The transition area can comprise terminal transducer fingers of both adjacent interdigital transducers, and/or comprise transducer fingers of an interdigital transducer and reflector strips of the adjacent reflector.

The static capacity of the resonator is decreased by the electric series interconnection in a longitudinal direction within the acoustic track. As a result of the special configuration in the transition area between two adjacent interdigital transducers, the real part of the admittance at the upper stopband edge is reduced and the quality of the series resonance is higher in comparison to a non-modified transducer/transducer transition. Reactance filters with less insertion loss and better rolloff can be constructed from high-quality resonators.

When the finger period is also higher in the transition area between a reflector and a transducer in comparison to the other area of the transducer or reflector, this fosters an improved characteristic of the admittance between the resonance and anti-resonance frequency, and reduces the first local maximum above the resonance frequency. This also reduces the ripple in the filter passband as well as the insertion loss since the resonator quality is improved.

A transition area with an increased finger period can be formed at both mutually facing ends of two longitudinally adjacent interdigital transducers. Likewise, the transition area can be formed at the end of an interdigital transducer facing a reflector as well as at the end of the reflector facing the transducer.

The invention relates to a resonator with at least two electrically series-connected interdigital transducers. However, it can also comprise more than two interdigital transducers that are electrically interconnected with each other and arranged adjacently in the acoustic track. The two connections between which the interdigital transducers are interconnected with each other can form an electric gate of the resonator and thus constitute the connections of the resonator.

If a resonator according to the invention comprises more than two interdigital transducers, some can also be interconnected in parallel, and some can be interconnected to each other in series. The interdigital transducers arranged longitudinally next to each other in the acoustic track can have any interconnection which comprises at least one series-interconnection and in which at least two interdigital transducers are parallel-connected within the series-interconnection.

The electric interconnection of two interdigital transducers in a resonator according to the invention can be achieved by means of a common bus electrode that is electrically floating, i.e., not connected to an external potential. It is, however, also possible to create the interconnection of two adjacently arranged interdigital transducers by non-exciting electrode fingers that electrically connect opposing bus electrodes. These non-exciting transducer fingers, hereinafter termed connecting fingers, thus extend transversely across the acoustic track.

The non-exciting connecting fingers that function as reflectors are preferably arranged offset from the electrode fingers.

It is moreover also possible to arrange a plurality of reflector strips between two adjacent interdigital transducers in the pattern of a transition area or in the normal pattern of an adjacent interdigital transducer. These reflector strips can comprise the aforementioned connecting fingers but can also be inserted in the resonator as a separate reflector.

According to a preferred embodiment of the invention, the connection sequence of the transducer fingers of all the interdigital transducers can be laid out such that the excitation function does not have a phase jump over the entire length of the resonator.

Filter arrangements according to the invention can also be constructed from the resonators according to the invention which comprise series-interconnected resonators (serial resonators) between the filter input and output, and resonators (parallel resonators) interconnected parallel thereto to a fixed potential. An inductor and in particular a coil can be arranged between the fixed potential and the parallel resonator.

At least one parallel resonator is formed according to the invention in the filter arrangement and has within the acoustic track at least two series-connected interdigital transducers that are arranged in the respective transition area between the two interdigital transducers or between an interdigital transducer and a reflector with an increased finger period. It is, however, also possible for a plurality or all of the parallel resonators to be designed correspondingly. One or more or all series resonators can also be series-interconnected interdigital transducers.

The parallel resonators in a filter arrangement according to the invention have different resonance frequencies according to one embodiment of the invention. At least the parallel resonator with the highest resonance frequency has the series-connected interdigital transducers with the transition area designed according to the invention.

According to one embodiment of the invention, the aforementioned transition area of at least one resonator in the filter arrangement according to the invention is designed such that the mutual distance of the interdigital transducers is greater in relation to the pattern of the transducer fingers outside of the transition area, and a phase shift accordingly results. The phase shift is selected such that the signals of the two interdigital transducers constructively overlap. This is achieved in any event when the angle phi of the phase shift satisfies the following equation: $-90° \leq phi \leq 90°$ In a resonator that has at least two electrically series-interconnected interdigital transducers, the static capacity is lower compared to a resonator that only has one interdigital transducer with the same number of fingers.

The invention will be explained in greater detail below with reference to exemplary embodiments and the accompanying nine figures. The figures are only schematic and not true-to-scale so that no relative or absolute dimensions can be inferred from them. Identical parts or parts that function in the same manner have the same reference numbers.

Figure 4:
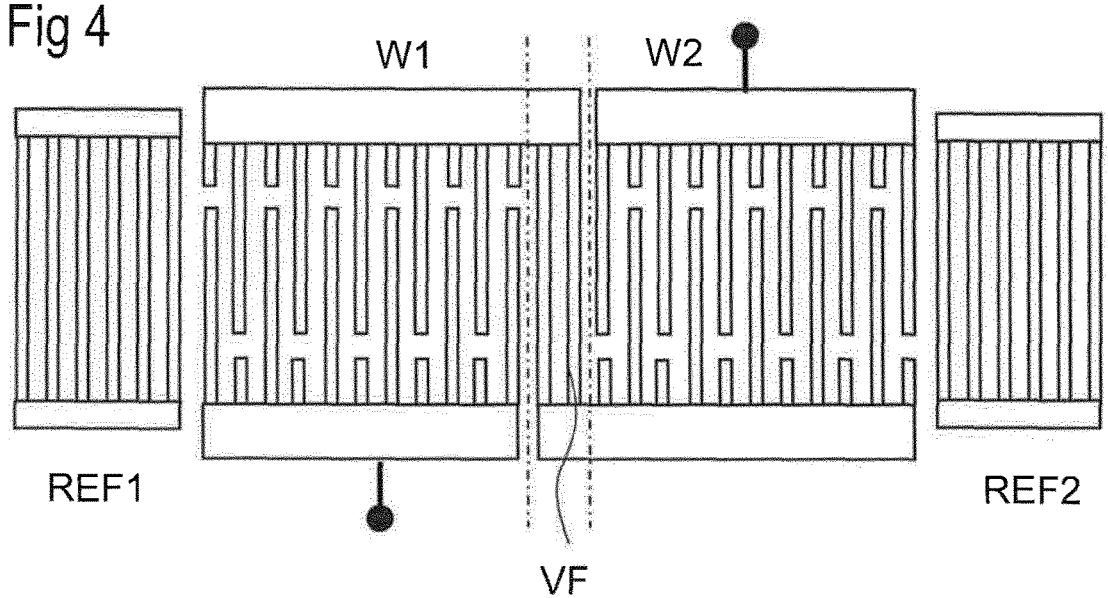
Figure 5:
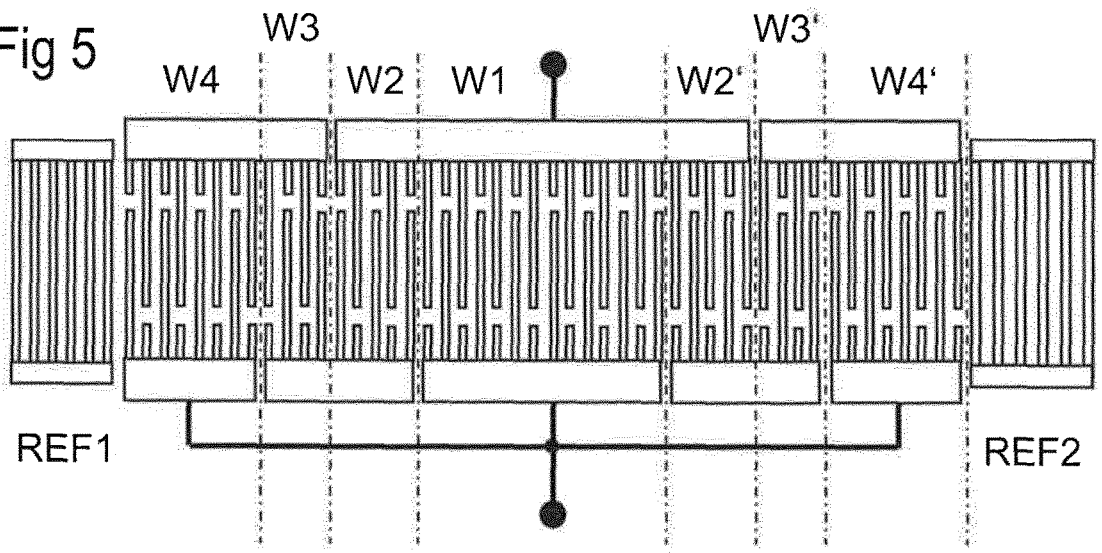
Figure 6:
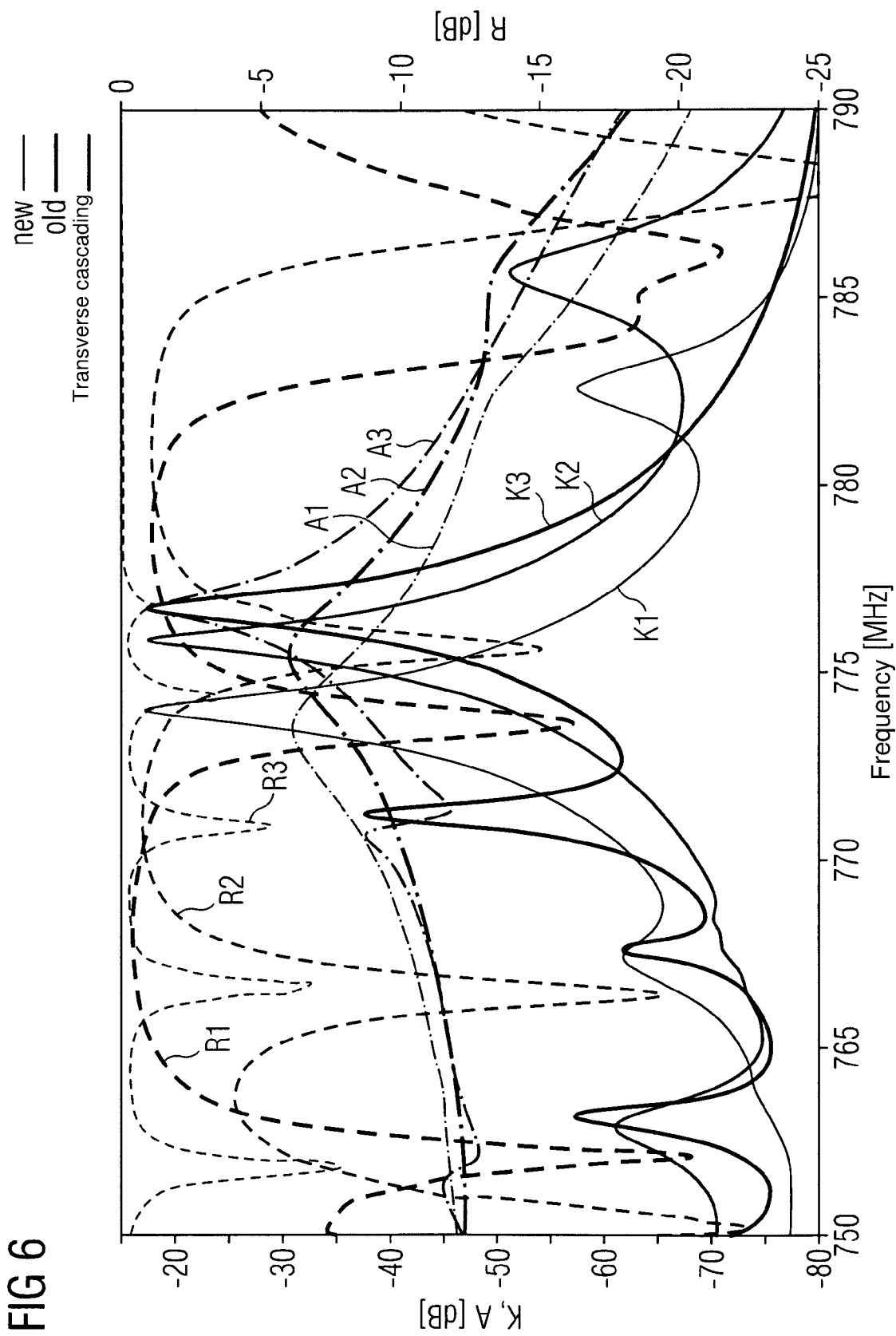
Figure 7:
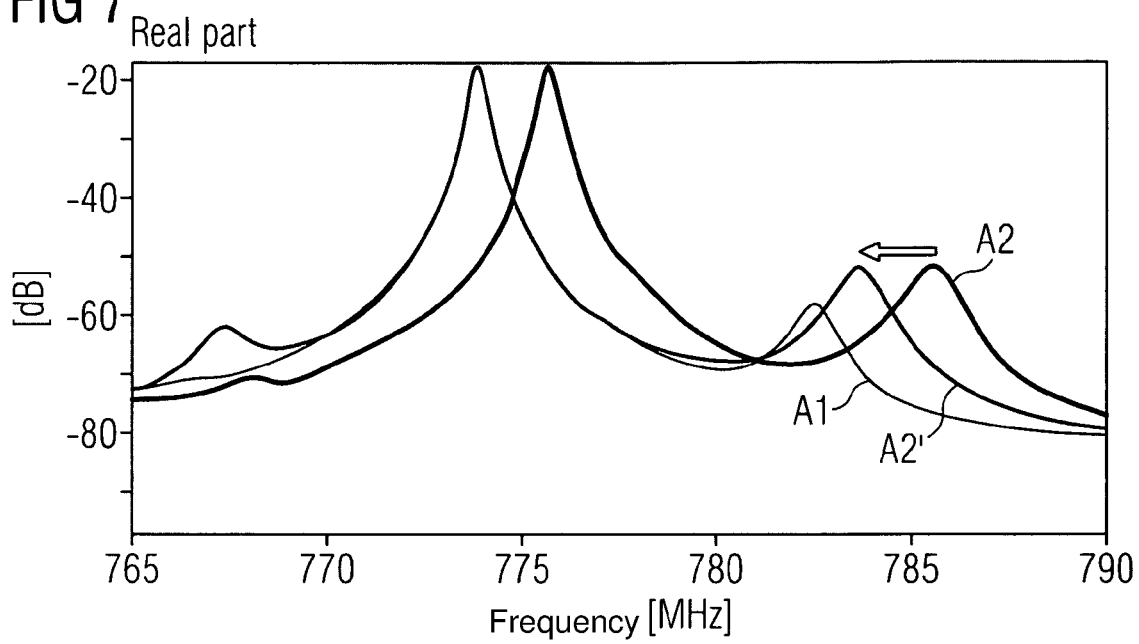
Figure 8:
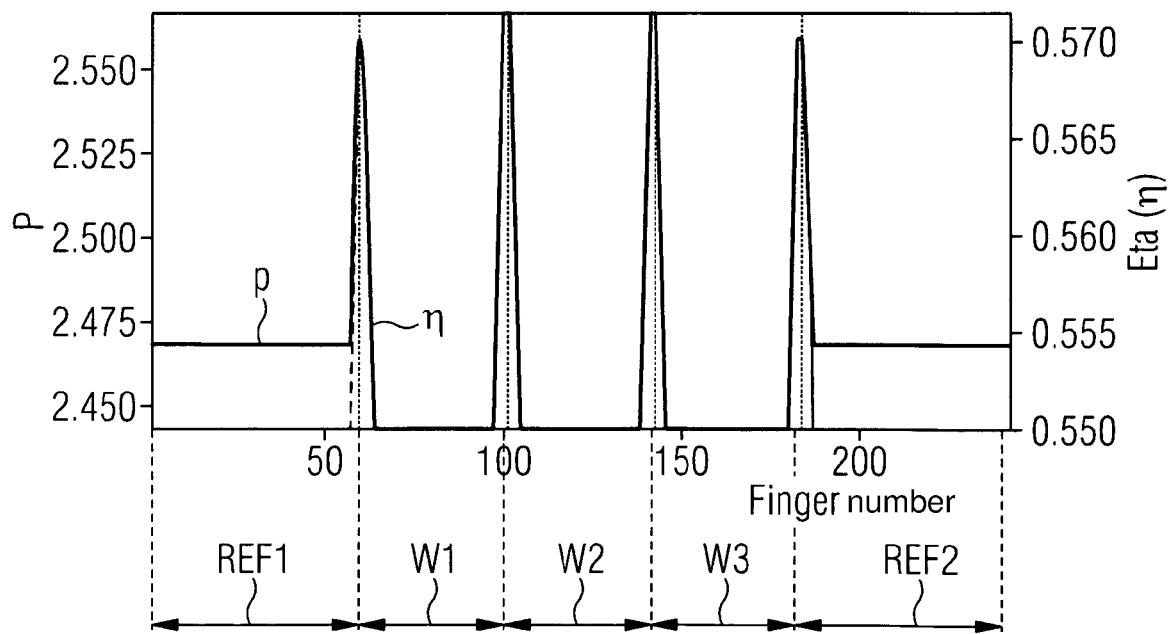
Figure 9:
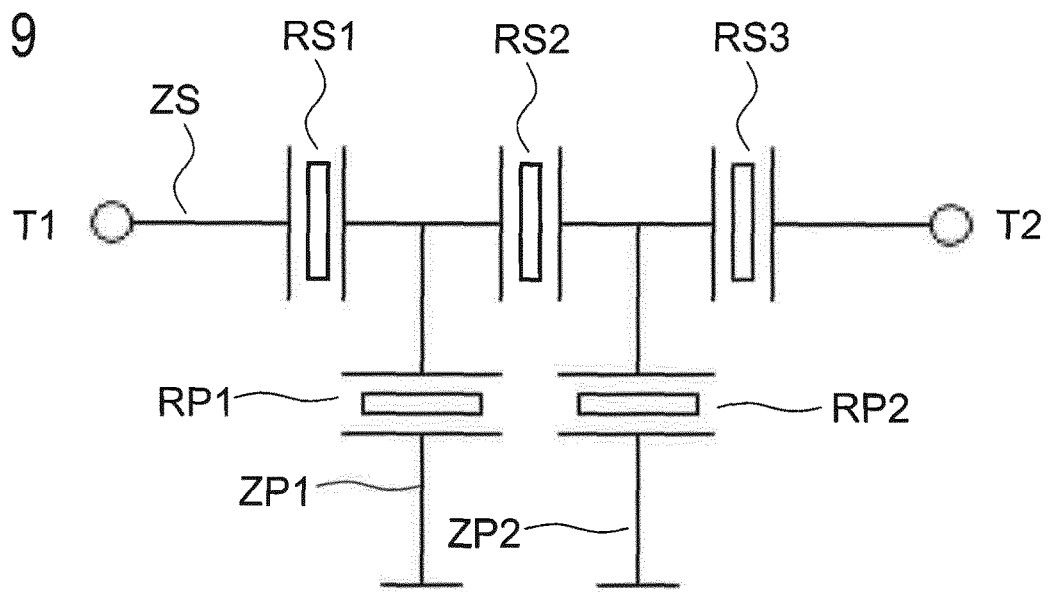
Figure 10:
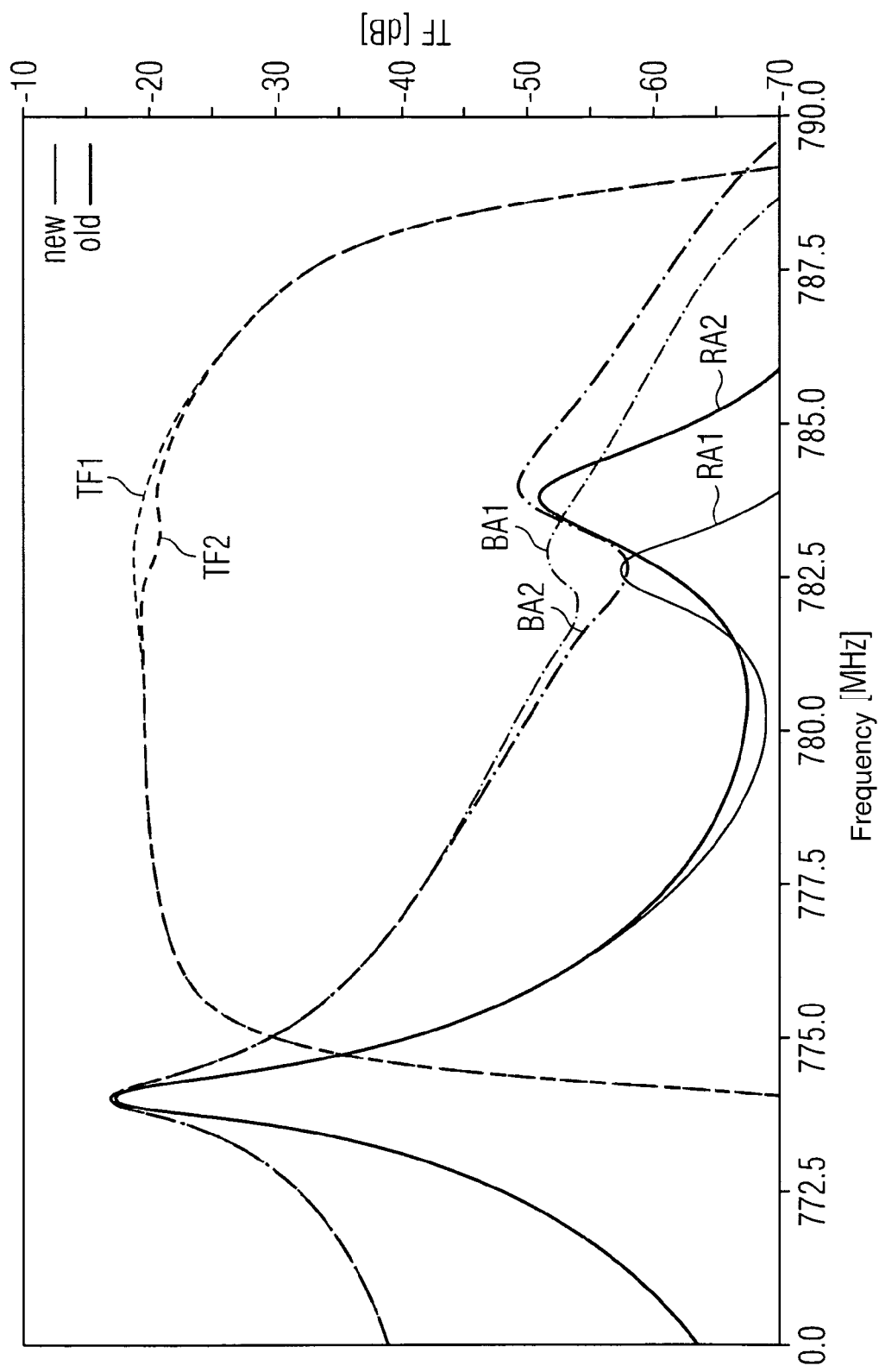

Shown are:

FIG. 1 a resonator with two longitudinally series-interconnected interdigital transducers in the acoustic track, FIG. 2 an example of a finger pattern of two interdigital transducers in the transition area, FIG. 3 a resonator with three longitudinally series-connected interdigital transducers, FIG. 4 a resonator with two interdigital transducers which are longitudinally series-interconnected with the assistance of the connecting fingers that electrically bridge the acoustic track, FIG. 5 a resonator with seven interdigital transducers, some of which are electrically series-interconnected, and some of which are electrically parallel-interconnected, FIG. 6 the conductance of a resonator according to the invention compared to resonators not according to the invention, FIG. 7 the admittance of a resonator according to the invention compared to the admittance of resonators not according to the invention, FIG. 8 the characteristic of the metalization ratio g and the finger period P in a longitudinal direction plotted against the number of fingers, FIG. 9 an exemplary filter arrangement in which at least one parallel resonator is designed according to the invention, FIG. 10 different properties of reactance filters according to the invention in comparison to reactance filters not according to the invention.

FIG. 1 shows a schematic view of the metalization structure of a resonator RES according to the invention. Within an acoustic track, a first interdigital transducer W1 and a second interdigital transducer W2 are arranged between a first reflector REF1 and a second reflector REF2 and are electrically series-connected between a first and a second connection T1, T2. Both the reflectors REF and the transducers W are depicted with a greatly reduced number of transducer fingers or electrode fingers for the sake of clarity. The transition areas at least between the two electrically interconnected interdigital transducers W1 and W2 are also not shown in the figure. It is a resonator according to the invention in which the finger period p is greater in the transition area than in the other area of the transducer. The electrical series-interconnection between the first and second transducer W1 and W2 is achieved by a common electrically floating bus electrode that is assigned to the two electrically interconnected transducers together.

FIG. 2 shows a section of the finger structure of a resonator according to the invention in the transition area between a first interdigital transducer W1 and a second interdigital transducer W2. The transition area in this case extends beyond both mutually facing ends of the adjacent transducers W1, W2, which are electrically interconnected with each other. Accordingly, the transition area comprises terminal electrode fingers of both adjacent interdigital transducers. The terminal transducer fingers of a transducer form an edge area, such as the edge area RB1 of the first transducer W1 and the second RB2 of the second transducer W2. Whereas in the remaining area of the respective transducer W an approximately constant finger period P0 measured between the centers of two adjacent fingers is configured, the electrode fingers arranged in the edge area RB contrastingly have a finger period P1 that is greater than P0. In the depicted exemplary embodiment, each of the two edge areas RB1, RB2 respectively comprises four electrode fingers. The transition area in this case comprises both edge areas RB1, RB2 and accordingly has eight electrode fingers. It is, however, also possible to arrange a greater or lesser number of electrode fingers in the edge area or to arrange a lesser or greater number of electrode fingers in the edge area with a higher finger period P1.

It is also possible for the entire transition area to comprise two edge areas that have a different number of electrode fingers.

Correspondingly, a transition area can also be formed between a transducer W and a reflector REF, said transition area comprising terminal electrode fingers and/or terminal reflector fingers that have a greater finger period in the transition area.

In a resonator according to the invention, it is unnecessary for the finger period P1 in the transition area to have a constant value. It is possible to differently define individual finger periods of two adjacent fingers in the transition area, wherein however the finger period P1 in the transition area is always chosen to be larger than the finger period P0 in the other area of the respective transducer and/or reflector.

FIG. 3 shows the metalization structure of a resonator according to the invention in which a first interdigital transducer W1, a second interdigital transducer W2 and a third interdigital transducer W3 are longitudinally series-connected between two electrical connections within the acoustic track. Two adjacent interdigital transducers W are respectively interconnected by a floating bus electrode that, for example, electrically connects the transducers W1 and W2, and the transducers W2 and W3 to each other. The reflectors REF1 and REF2 that limit the acoustic track on both sides can be electrically floating but, however, are preferably connected to a fixed potential and especially to ground.

Depending on whether one of the outer connections of the reflector comprises a ground electrode, the respective reflector can be electrically connected to this ground electrode. Transition areas according to the invention are formed in each case between two interdigital transducers that are adjacent to each other, and can additionally be formed in the transition area between the terminal interdigital transducers and the adjacent reflectors REF.

FIG. 4 shows the metalization structure of another exemplary embodiment in which a first and a second interdigital transducer are electrically series-connected between two connections in a longitudinal direction. The series interconnection between the first and second interdigital transducer is created by at least one connecting finger VF that electrically connects two opposing bus electrodes to each other transversely across the acoustic track. In this case as well, the transition area between the first and second interdigital transducer is formed with a greater finger period. The connecting finger or connecting fingers VF is/are part of the finger structure that has the greater finger period.

The electrical interconnection of two adjacent interdigital transducers W can also comprise more than one connecting finger VF. Two connecting fingers VF are depicted in the figure. In the figures, the borders between adjacent transducers, between the transducers and reflectors, and between the transducers and the connecting fingers VF are indicated by dot-dashed lines in order to make it easier to assign the structures.

FIG. 5 shows the metalization structure of another resonator according to the invention in which a total of seven interdigital transducers are electrically interconnected to each other. A first interdigital transducer W1 is directly connected between the first and second connection T1, T2. Moreover, a first series interconnection consisting of the interdigital transducers W2, W3 and W4 is interconnected between the two connections T1, T2. Another series-interconnection of the interdigital transducers W2', W3' and W4' is also interconnected between the two electrical connections T1, T2. This accordingly yields a parallel interconnection of the first and second series interconnection and the first interdigital transducer W1.

The advantage of such a design is that the static capacity of the resonator can be very finely adjusted in this case. Another advantage is that an excitation profile can be configured that corresponds to the longitudinal mode. A resonator according to the invention can, however, also have similar and not necessarily symmetrically designed partial interconnections consisting of series and parallel interconnections of interdigital transducers.

The number of transducer fingers in the series-interconnected interdigital transducers does not have to be the same. The finger period between adjacent interdigital transducers or between interdigital transducers of the same acoustic track in general can also be the same or slightly different as well.

It applies to all of the exemplary embodiments of resonators according to the invention that they are better suitable for steep-edge filters by being parallel-connected to a capacitor. Such a capacitor can for example be realized by an interdigital transducer that has a finger period different from the resonator and in particular smaller. The interdigital transducer parallel-connected to the resonator and used as a capacitor can be arranged in a longitudinal extension of the resonator. It is, however, also possible to arrange it offset from the acoustic track and in particular vertically thereto so that acoustic waves generated in this transducer functioning as a capacitor experience a direction of propagation 90° askew from the resonator.

FIG. 6 shows three different types of curves for interdigital transducers or resonators according to the invention compared with resonators and transducers that differ therefrom, some of which are known. The curves R1 to R3 show the short circuit reflection P11 at the outer acoustic transducer gates, measured in each case without reflectors. Index 1 corresponds to the curve for an interdigital transducer designed according to the invention, whereas the curves with index 2 are for longitudinally series-interconnected interdigital transducers without modification in the transition area. The curves with index 3 relate to an interdigital transducer with transverse cascading.

Curves A1 to A3 represent the real part of the transducer admittance of the acoustic track of the resonator, however without reflectors. Curves K1 to K3 show the progression of the conductance plotted against the frequency for the overall resonator, i.e., the complete acoustic track including reflectors. What is most striking about the conductance curve K1 for a resonator according to the invention is that the secondary peak above the primary peak is reduced and is closer to the primary peak than that of curve K2 which corresponds to a resonator without modification in the transition area.

The array of curves for the short-circuit reflection R reveals that the upper stopband edge shifts from R3 via R2 to R1 toward lower frequencies, i.e., closer to the maximum conductance. Above the upper stopband edge, the filter becomes transparent again which is revealed in all of the curves R by a local minimum.

FIG. 7 shows the real part of the resonator admittance in three curves A1, A2, A2'. A2 and A2' represent the admittance of a resonator with a longitudinal series interconnection of the interdigital transducers but without modification in the transition area between interdigital transducers or between interdigital transducer and reflector. Curve A2' is identical to curve A2, although shifted relative to A2 by −2393 ppm so that it is arranged scaled to the curve A1 in order to shift the main peaks over each other to make it easier to compare the curve progression. A comparison of the curves A1 and A2' reveals that the secondary peak above the main peak in curve A1, i.e., in a resonator according to the invention, is closer to the main peak and is characterized by a lower height.

FIG. 8 depicts how the finger period p and the metalization ratio η can be modified in the transition area in the resonator according to the invention. As with FIGS. 6 and 7, a resonator with a total of three interdigital transducers W between the two reflectors REF is considered here, which resonator is designed according to FIG. 3. The respective number of the transducer finger or reflector finger is used as a unit of measure for the x-axis. In general, the finger period P in the two reflectors REF1 and REF2 is higher in comparison to the interdigital transducers. In contrast, the metalization ratio, which indicates a measure of the amount of metalized surface over the longitudinal x-axis, assumes an equivalent value in the reflector and the transducer interior. Things are contrastingly different in the transition areas at the border between the first reflector REF1 and the first transducer W1, between the first and second transducer W1, W2, between the second and the third transducer W2, W3 and between the third transducer and the second reflector W3, REF2. In this case, over an area of 8 to 10 fingers, both the finger period P and the metalization ratio η are much higher. The finger period fluctuates between a minimum of 2.444 µm in the central area of the interdigital transducer and a value of 2.567 µm in the two center transition areas. The metalization ratio r fluctuates between a value of 0.550 in the reflector and in the interior of the interdigital transducer and a maximum of 0.575 in the center of the transition area. The exemplary embodiment shown in FIG. 8 reveals a steady progression of P and η in the transition areas. This means that the values continuously rise toward the center of the transition area and then continuously decrease again. In this exemplary embodiment, this progression is configured to be nearly equivalent in all of the transition areas.

It is, however, also possible to have at least the finger period rise in one or more steps up to the maximum value in the center of the transition area. From a purely production vantage point, the steady progression of P and η in the transition area is however beneficial since it proves to be advantageous for the employed metalization method or structuring method of the metalization. In other possible embodiments of the invention, finger periods measured in each case between two adjacent fingers have different values but do not form a steady progression or a plateau in the transition area.

FIG. 9 shows a schematic representation of a potential design of a reactance filter that has a resonator according to the invention at least in a parallel resonator. The depicted reactance filter consists of a serial branch ZS that is connected between a first connection T1 and a second connection T2. In the serial branch ZS, three resonators RS are series-interconnected: a first serial resonator RS1, a second serial resonator RS2, and a third serial resonator RS3. Two parallel branches ZP1 and ZP2 with a parallel resonator RP1, RP2 arranged in each are parallel-connected to the serial branch ZS. The parallel branches connect the serial branch ZS to a fixed potential, normally to ground.

The resonance frequencies can be slightly offset from each other in all the resonators which results in an enlargement of the passband. The parallel resonator RP with the highest resonance frequency experiences the maximum performance in the depicted reactance filter, especially when the filter is used as a transmission filter. Preferably, this parallel resonator is therefore designed according to the invention which possesses the highest resonance frequency. As a result of the design according to the invention, this resonator is significantly more performance-resilient without having a higher static capacity.

In FIG. 10, two types of curves are again superimposed in a joint depiction that illustrates different properties of resonators according to the invention and reactance filters produced from resonators according to the invention. The real part RA and the amount BA of the admittance of the resonators according to the invention are depicted. The advantages of the invention whose curves RA and BA are designated by index 1 become clear by comparing them with the corresponding curves of resonators not according to the invention or with filters without resonators according to the invention, whose curves RA and BA are designated by index 2. A third pair of curves TF1, TF2 indicates the transmission function of a reactance filter that is designed, for example, as in FIG. 9 and in which a parallel resonator is designed according to the invention.

A significant advantage of the invention immediately becomes evident when comparing the two transmission functions TF1, TF2. In the transmission function TF1 for the filter according to the invention, a slight ripple in the passband, which is only visible in the filter not according to the invention and which leads to a small drop in the passband, is completely compensated and smoothed.

The invention could only be described in reference to a few exemplary embodiments and is therefore not limited to these. Other possible variations result in particular from the number and size of the interdigital transducers interconnected with each other or from the number of electrode fingers in the interdigital transducers, which electrode fingers may differ for individual interdigital transducers. Another possible variation results in the form of different interconnection options, which are not restricted to the interconnection options portrayed in FIG. 1 to 5. Both the length of overlap, which is a measure of the excitation strength, and the finger period remain constant in the exemplary embodiments in the interior of the transducer, i.e., outside of the transition area. It is, however, also possible to vary the finger period, the metalization ratio, and the excitation strength across the resonator and also solely across the individual interdigital transducers.

Resonators according to the invention can be used in reactance filters that deviate from the reactance filter depicted in FIG. 9. In particular, a larger number of parallel branches ZP, a larger or a smaller number of serial resonators RS, or a different sequence of serial resonators and parallel branches between the two connections T1 and T2 are conceivable. A reactance filter can be formed completely from SAW resonators and is formed according to the invention in at least one resonator in the transition area according to the invention. It is however also possible for individual resonators to use different types. Moreover, it is possible to modify both individual resonators and the entire filter by additional passive switching elements, such as the already addressed capacitors, which can be parallel-connected to individual resonators or parallel-connected to the entire reactance filter. Moreover, it is possible to interconnect serial inductors in the serial branch ZS and in each of the individual parallel branches ZP.

LIST OF REFERENCE SIGNS

RES Resonator
AS Acoustic track

REF Reflectors
W Interdigital transducer
T Connections
RES Resonator
WF Transducer finger
RB Edge area
P Finger period
n Number of transducer fingers in the transition area
RS Series resonator
RP Parallel resonator
ZS Series branch
ZP Parallel branch
VS Connection structure
A, BA, RA Admittance
R Short-circuit reflection
K Conductance
η Metalization thickness eta
TF Transmission function
UEB Transition area

The invention claimed is:

1. A resonator comprising:
    more than two interdigital transducers arranged next to each other in a longitudinal direction within an acoustic track delimited by reflectors,
    wherein the interdigital transducers are electrically connected between two connections,
    wherein a transition area is formed across each of mutually facing ends of the interdigital transducers that are adjacent to each other,
    wherein each of the transition areas comprises n terminal transducer fingers which are assigned to one or more of the adjacent interdigital transducers,
    wherein a finger period p, which is defined as a distance between finger centers of adjacent transducer fingers, is higher in the transition areas in comparison to remaining areas of the interdigital transducers, and
    wherein n is a whole number with $1<n<16$.

2. The resonator according to claim 1, wherein the interdigital transducers comprise a same number of transducer fingers in each of the transition areas.

3. The resonator according to claim 1, wherein the two connections form an electric gate of the resonator.

4. The resonator according to claim 1, wherein some of the interdigital transducers are parallel-interconnected and others are series-interconnected with each other.

5. The resonator according to claim 4, wherein an electric interconnection of two interdigital transducers is created by means of a common floating bus electrode that is not connected to an external potential, and/or by means of non-exciting connecting fingers that connect two floating bus electrodes of adjacent interdigital transducers transversely across the acoustic track.

6. The resonator according to claim 5, wherein a plurality of reflector strips is arranged between the two adjacent and electrically series-connected interdigital transducers.

7. The resonator according to one of claim 1-2 or 3-6, wherein a connection sequence of the transducer fingers of all the interdigital transducers is laid out such that there is no phase jump in an excitation function over the entire resonator.

8. A filter arrangement comprising series resonators that are series-interconnected between a filter input and output, and parallel resonators that are interconnected parallel thereto to a fixed potential, wherein at least one of the parallel resonators is designed according to one of the claims 1, 2 or 3 to 5.

9. The filter arrangement according to claim 8, comprising a plurality of parallel resonators that have different resonance frequencies, wherein the parallel resonator with the highest resonance frequency comprising series-connected interdigital transducers with the transition area.

10. The filter arrangement according to claim 8, wherein:
    the transition area is designed such that a mutual distance of the interdigital transducers in relation to a pattern of the transducer fingers outside of the transition area is greater and a phase shift accordingly results, and
    the phase shift is selected such that signals of the two interdigital transducers constructively overlap.

11. The filter arrangement according to claim 10, wherein a static capacitance of the parallel resonator, comprising the series-connected interdigital transducers, is lower than a static capacitance of the other resonators.

* * * * *